(12) United States Patent
Kim et al.

(10) Patent No.: US 12,063,848 B2
(45) Date of Patent: Aug. 13, 2024

(54) MASK AND METHOD OF MANUFACTURING THE SAME

(71) Applicant: SAMSUNG DISPLAY CO., LTD., Yongin-si (KR)

(72) Inventors: Seil Kim, Hwaseong-si (KR); Euigyu Kim, Suwon-si (KR); Kwanhee Lee, Hwaseong-si (KR); Sang Min Yi, Suwon-si (KR); Junhyeuk Ko, Yongin-si (KR); Seungju Hong, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 18/187,047

(22) Filed: Mar. 21, 2023

(65) Prior Publication Data
US 2023/0232698 A1    Jul. 20, 2023

Related U.S. Application Data

(62) Division of application No. 17/231,652, filed on Apr. 15, 2021, now Pat. No. 11,616,198.

(30) Foreign Application Priority Data

Jul. 17, 2020   (KR) .......................... 10-2020-0089131

(51) Int. Cl.
*C23C 14/04*   (2006.01)
*B05C 21/00*   (2006.01)
(Continued)

(52) U.S. Cl.
CPC ......... *H10K 71/166* (2023.02); *B05C 21/005* (2013.01); *C23C 14/042* (2013.01); *H10K 71/00* (2023.02); *H10K 71/164* (2023.02)

(58) Field of Classification Search
None
See application file for complete search history.

(56) References Cited

U.S. PATENT DOCUMENTS 6,955,726 B2   10/2005   Kang et al.
8,778,115 B2    7/2014   Lee et al.
(Continued)

FOREIGN PATENT DOCUMENTS

CN   108091775   5/2018
JP   2004-091830 A2   3/2004
(Continued)

*Primary Examiner* — Jethro M. Pence
(74) *Attorney, Agent, or Firm* — F. CHAU & ASSOCIATES, LLC

(57) ABSTRACT

A mask includes a first mask that includes a first long side that extends in a first direction and a first short side that extends in a second direction that crosses the first direction and that includes a first edge portion, a first center portion, and a first welded portion, that are sequentially arranged in the first direction. The mask further includes a second mask that includes a second long side that extends in the first direction and a second short side that extends in the second direction and that includes a second welded portion, a second center portion, and a second edge portion, that are sequentially arranged in the first direction. The first welded portion is in contact with the second welded portion.

8 Claims, 15 Drawing Sheets

(51) Int. Cl.
*H10K 71/00* (2023.01)
*H10K 71/16* (2023.01)

(56) References Cited

U.S. PATENT DOCUMENTS

| | | | |
|---|---|---|---|
| 8,869,738 B2 | 10/2014 | Shin et al. | |
| 8,926,480 B2 | 1/2015 | Kim | |
| 9,018,647 B2 | 4/2015 | Sung et al. | |
| 9,141,001 B2 | 9/2015 | Kim | |
| 9,259,805 B2 | 2/2016 | Kim et al. | |
| 9,673,424 B2 | 6/2017 | Han | |
| 9,695,500 B2 | 7/2017 | Ko et al. | |
| 11,214,858 B2 | 1/2022 | Jin et al. | |
| 11,618,198 B2 | 3/2023 | Kim et al. | |
| 11,629,397 B2 * | 4/2023 | Ahn | H10K 71/00 438/34 |
| 2008/0019166 A1 | 1/2008 | Jung et al. | |
| 2011/0139365 A1 | 6/2011 | Kim et al. | |
| 2011/0139367 A1 | 6/2011 | Lee et al. | |
| 2015/0114287 A1 | 4/2015 | Kim | |
| 2016/0079668 A1 | 3/2016 | Han | |
| 2017/0125680 A1 | 5/2017 | Lee et al. | |
| 2019/0144987 A1 | 5/2019 | Guo et al. | |
| 2019/0305222 A1 | 10/2019 | Jung et al. | |
| 2020/0083451 A1 | 3/2020 | Ha et al. | |
| 2021/0108303 A1 | 4/2021 | Ahn et al. | |
| 2021/0249603 A1 | 8/2021 | Kim et al. | |
| 2022/0018011 A1 * | 1/2022 | Ko | C23C 14/042 |
| 2022/0020926 A1 | 1/2022 | Kim et al. | |
| 2022/0042160 A1 | 2/2022 | Sato et al. | |
| 2023/0225179 A1 | 7/2023 | Kim et al. | |
| 2023/0232698 A1 | 7/2023 | Kim et al. | |
| 2023/0240124 A1 | 7/2023 | Kim et al. | |

FOREIGN PATENT DOCUMENTS

| | | |
|---|---|---|
| JP | 3785509 | 6/2006 |
| JP | 2010-090415 A2 | 4/2010 |
| KR | 10-0171162 B1 | 2/1999 |
| KR | 10-2007-0120266 | 12/2007 |
| KR | 10-0908232 | 7/2009 |
| KR | 10-1029999 B1 | 4/2011 |
| KR | 10-1182235 | 9/2012 |
| KR | 10-2016-0127290 | 11/2016 |
| KR | 10-1878058 | 11/2016 |

* cited by examiner

MASK AND METHOD OF MANUFACTURING THE SAME

CROSS-REFERENCE TO RELATED APPLICATION

This U.S. non-provisional patent application is a divisional of U.S. patent application Ser. No. 17/231,652, filed on Apr. 15, 2021 in the U.S. Patent and Trademark Office, which claims priority under 35 U.S.C. § 119 from, and the benefit of, Korean Patent Application No. 10-2020-0089131, filed on Jul. 17, 2020 in the Korean Intellectual Property Office, the contents of both of which are herein incorporated by reference in their entireties.

BACKGROUND

1. Technical Field

Embodiments of the present disclosure are directed to a mask and a method of manufacturing the mask. More particularly, embodiments of the present disclosure are directed to a mask that includes a plurality of masks welded to each other and a method of manufacturing the mask.

2. Discussion of the Related Art

A display panel includes a plurality of pixels. Each of the pixels includes a driving element, such as a transistor, and a display element, such as an organic light emitting diode. The display element is formed by stacking an electrode and a light emission pattern on a substrate.

The light emission pattern is patterned using a mask through which open areas are formed. The light emission pattern is formed to correspond to the open areas of the mask. In recent years, research has been conducted regarding large-size masks to improve manufacturing efficiency of the display element.

SUMMARY

Embodiments of the present disclosure provide a mask that can improve an efficiency of a manufacturing method of a display device.

Embodiments of the present disclosure provide a method of manufacturing the mask, which can improve the efficiency of the manufacturing method of the display device.

Embodiments of the inventive concept provide a mask that includes a first mask that includes a first long side that extends in a first direction and a first short side that extends in a second direction that crosses the first direction, where the first mask includes a first edge portion, a first center portion, and a first welded portion, that are sequentially arranged in the first direction. The mask further includes a second mask that includes a second long side that extends in the first direction and a second short side that extends in the second direction, where the second mask includes a second welded portion, a second center portion, and a second edge portion, that are sequentially arranged in the first direction. The first welded portion is in contact with the second welded portion.

The first welded portion extends from the first center portion, one end of the first welded portion is the first short side, the second welded portion extends from the second center portion, and one end of the second welded portion is the second short side.

The first short side of the first mask is in contact with the second short side of the second mask.

The first long side is aligned with the second long side in the first direction.

The first mask further includes a first perforated hole formed through the first welded portion, the second mask further includes a second perforated hole formed through the second welded portion, and the first perforated hole and the second perforated hole overlap each.

A plurality of each of the first perforated holes and the second perforated holes are provided.

The first mask further includes a first alignment mark disposed on an upper surface of the first welded portion, the second mask further includes a second alignment mark disposed on an upper surface of the second welded portion, and the first alignment mark overlaps the second alignment mark.

The first welded portion further includes a first half-etching portion, and the second welded portion further includes a second half-etching portion.

Each of the first welded portion and the second welded portion includes one of an inclined surface or steps.

The first welded portion further includes a first concave-convex portion that has an oscillating shape in a plane, the second welded portion further includes a second concave-convex portion that has an oscillating shape in a plane, and the first concave-convex portion is engaged with the second concave-convex portion.

The first mask further includes a first perforated hole formed through the first concave-convex portion, the second mask further includes a second perforated hole formed through the second concave-convex portion, where the first perforated hole overlaps the second perforated hole.

The mask further includes a metallic thin film that overlaps the first and second concave-convex portions and is disposed on an upper surface of each of the first and second masks.

The first center portion includes a first open area in which an opening is formed and a first non-open area adjacent to the first open area, and the second center portion includes a second open area in which another opening is formed and a second non-open area adjacent to the second opening area.

Each of the first and second masks has a thickness equal to or less than about 50 micrometers.

Embodiments of the inventive concept provide a method of manufacturing a mask. The manufacturing method of the mask includes preparing a first mask that includes a first long side that extends in a first direction and a first short side that extends in a second direction that crosses the first direction, where the first mask includes a first edge portion, a first center portion, and a first welded portion, that are sequentially arranged in the first direction. The manufacturing method of the mask further includes preparing a second mask that includes a second long side that extends in the first direction and a second short side that extends in the second direction, where the second mask includes a second welded portion, a second center portion, and a second edge portion, that are sequentially arranged in the first direction. The manufacturing method of the mask further includes welding the first welded portion to the second welded portion.

The method further includes aligning the first and second masks with each other. The first mask further includes a first perforated hole formed through the first welded portion, the second mask further includes a second perforated hole formed through the second welded portion, where aligning the first and second masks allows the first perforated hole to overlap the second perforated hole after preparing the first and second masks.

The method further includes aligning the first and second masks with each other. The first mask further includes a first alignment mark disposed on an upper surface of the first welded portion, the second mask further includes a second alignment mark disposed on an upper surface of the second welded portion, where aligning the first and second masks allows the first alignment mark to overlap the second alignment mark after preparing the first and second masks.

The first welded portion of the first mask includes a first pattern is formed at one end, and the second welded portion of the second mask includes a second pattern is formed at one end. The method further includes aligning the first pattern with the second pattern after preparing the first and second masks.

The first pattern and the second pattern are formed by a half-etching process.

Each of the first pattern and the second pattern includes one of an inclined surface or steps.

Each of the first pattern and the second pattern has an oscillating shape.

The first welded portion further includes a first perforated hole formed adjacent to the first pattern, the second welded portion further includes a second perforated hole formed adjacent to the second pattern, and aligning the first and second masks further includes aligning the first mask with the second mask to allow the first perforated hole to overlap the second perforated hole.

The method further includes disposing a metallic thin film on the first welded portion and the second welded portion after aligning the first and second masks with each other. Welding the first and second welded portions includes welding the first welded portion, the second welded portion, and the metallic thin film to each other.

Embodiments of the inventive concept provide a mask. The mask includes a rectangular first mask that includes an edge portion, a center portion, and a welded portion, that are sequentially arranged in a lengthwise direction of the first mask. The welded portion extends from the center portion, one end of the welded portion is a short side of the mask, and the short side of the mask is in contact with a short side of a rectangular second mask.

The rectangular first mask further includes a long side that is substantially perpendicular to the short side of the first mask, the rectangular second mask includes a long side that is substantially perpendicular to the short side of the second mask, and the long side of the first mask is aligned with the long side of the second mask.

According to the above, the mask may have the large area.

According to a manufacturing method of the mask, a mask having a large area can be provided.

DETAILED DESCRIPTION

Figure 1:
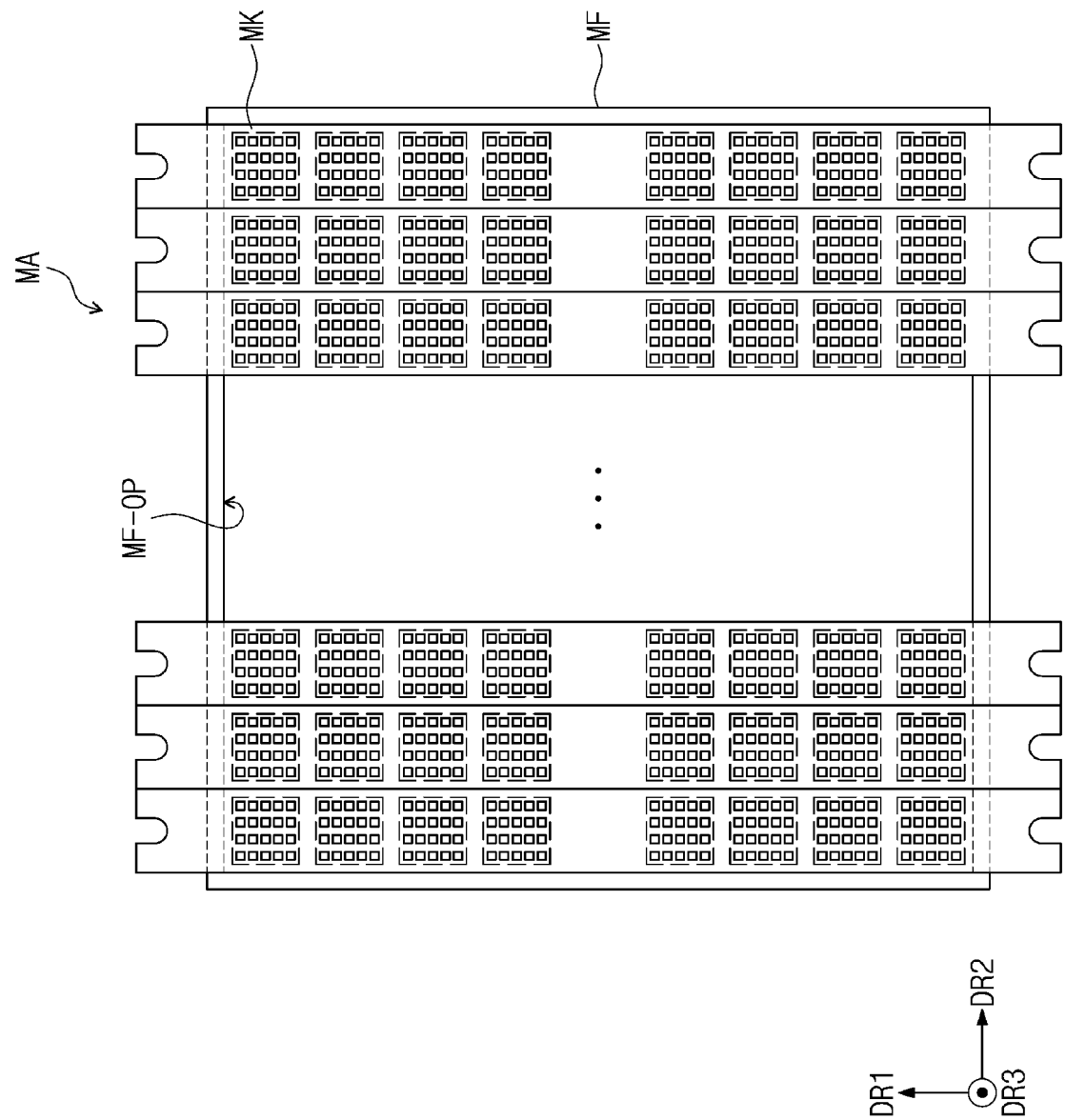
FIG. 1 is a plan view of a mask assembly according to an embodiment of the present disclosure.

In the present disclosure, it will be understood that when an element or layer is referred to as being "on", "connected to" or "coupled to" another element or layer, it can be directly on, connected or coupled to the other element or layer or intervening elements or layers may be present.

Like numerals may refer to like elements throughout. In the drawings, the thickness, ratio, and dimension of components may be exaggerated for effective description of the technical content.

Hereinafter, embodiments of the present disclosure will be described with reference to accompanying drawings.

Figure 2:
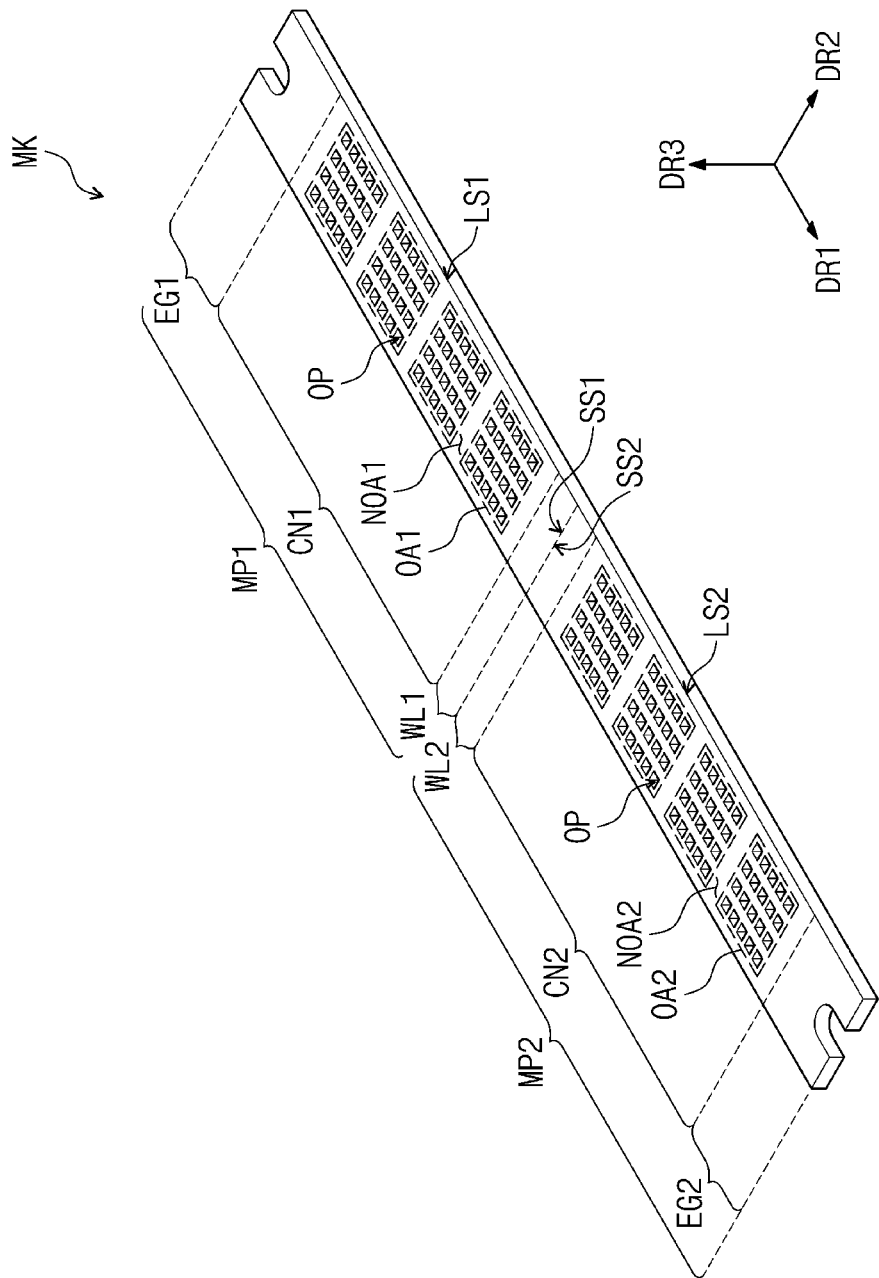
FIG. 2 is a perspective view of a mask according to an embodiment of the present disclosure.

FIG. 1 is a plan view of a mask assembly MA according to an embodiment of the present disclosure. FIG. 2 is a perspective view of a mask MK according to an embodiment of the present disclosure.

The mask assembly MA may be used in a process that manufactures a display device. In detail, the mask assembly MA may be used in a process of depositing an organic light emitting element layer on a deposition substrate of the display device.

According to an embodiment, the mask assembly MA includes a plurality of masks MK and a mask frame MF. The mask frame MF according to an embodiment has a rectangular shape that has sides that extend in a first direction DR1 and sides that extend in a second direction DR2. The second direction DR2 crosses the first direction DR1. However, the shape of the mask frame MF is not be limited thereto, and may have other shapes in other embodiments.

Hereinafter, a direction substantially perpendicular to a plane defined by the first direction DR1 and the second direction DR2 is referred to as a "third direction DR3". In the present disclosure, "in a plane" refers to a state of being viewed in the third direction DR3.

According to an embodiment, the mask frame MF has a rectangular ring shape when viewed in a plane. In detail, the mask frame MF has a frame opening MF-OP formed therethrough. The frame opening MF-OP overlaps at least a portion of each of the masks MK.

According to an embodiment, the mask frame FM includes a metal. For example, the mask frame FM may include Invar, which has a relatively low coefficient of thermal expansion. The mask frame FM may include, for example, nickel (Ni), a nickel-cobalt alloy, a nickel-iron alloy, etc. Since the mask frame MF includes a metal, the mask frame MF will be sufficiently rigid.

According to an embodiment, the masks MK are fixed to the mask frame MF. For example, the masks MK are arranged in the second direction DR2 and are fixed to the mask frame MF.

Referring to FIG. 2, the mask MK according to an embodiment extends in the first direction DR1. The mask MK includes at least a first mask MP1 and a second mask MP2, which are arranged in the first direction DR1. According to an embodiment, the first mask MP1 is in contact with the second mask MP2.

According to an embodiment, the first mask MP1 includes a first long side LS1 that extends in the first direction DR1 and a first short side SS1 that extends in the second direction DR2. The first mask MP1 includes a first edge portion EG1, a first center portion CN1, and a first welded portion WL1, that are sequentially arranged in the first direction DR1. The first center portion CN1 extends from the first edge portion EG1 to meet the first welded portion WL1, and the first welded portion WL1 extends from the first center portion CN1.

According to an embodiment, the first edge portion EG1, the first center portion CN1, and the first welded portion WL1 are arranged along the first long side LS1. One end of the first welded portion WL1 is the first short side SS1.

According to an embodiment, the first center portion CN1 includes a first open area OA1 through which openings OP are formed and a first non-open area NOA1 adjacent to the first open area OA1. The first non-open area NOA1 surrounds the first open area OA1.

FIGS. 1 and 2 show four first open areas OA1 in the first mask MP1, however, embodiments are not limited thereto. The number of first open areas OA1 in the first mask MP1 may be equal to or less than three or greater than four.

In addition, according to an embodiment, the openings OP are arranged in a matrix form in the first open area OA1 as shown in FIG. 2, however, embodiments are not limited thereto. For example, the openings OP might not be formed in some areas of the first open area OA1.

According to an embodiment, each opening OP has a rectangular shape as shown in FIG. 2, however, embodiments are not limited thereto. The openings OP may have a variety of shapes, such as a circular shape or a polygonal shape.

According to an embodiment, the openings OP extend through the first mask MP1. Alternatively, the openings OP may be recessed portions of the first mask MP1.

According to an embodiment, the second mask MP2 includes a second long side LS2 that extends in the first direction DR1 and a second short side SS2 that extends in the second direction DR2.

According to an embodiment, the second mask MP2 includes a second welded portion WL2, a second center portion CN2, and a second edge portion EG2, that are sequentially arranged in the first direction DR1. The second center portion CN2 extends from the second edge portion EG2 to meet the second welded portion WL2, and the second welded portion WL2 extends from the second center portion CN2.

According to an embodiment, the second welded portion WL2, the second center portion CN2, and the second edge portion EG2 are arranged along the second long side LS2. One end of the second welded portion WL2 is the second short side SS2.

According to an embodiment, the second center portion CN2 includes a second open area OA2 through which openings OP are formed and a second non-open area NOA2 adjacent to the second open area OA2. The second non-open area NOA2 surrounds the second open area OA2.

FIGS. 1 and 2 show four second open areas OA2 in the second mask MP2, however, embodiments are not limited thereto. The number of the second open areas OA2 in the second mask MP2 may be equal to or less than three or greater than four.

Descriptions of the openings OP in the first open area OA1 also apply to the openings OP in the second open area OA2.

According to an embodiment, the first welded portion WL1 is in contact with the second welded portion WL2. For example, the first short side SS1 of the first welded portion WL1 is in contact with the second short side SS2 of the second welded portion WL2.

According to an embodiment, the first welded portion WL1 is connected to the second welded portion WL2 by welding. That is, the mask MK is obtained by welding the first welded portion WL1 to second welded portion WL2.

The mask MK according to an embodiment includes the first mask MP1 and the second mask MP2 connected to the first mask MP1, and thus, one mask MK includes a plurality of open areas OA1 and OA2. For example, a sum of the number of the first open areas OA1 and the number of the second open areas OA2 in the mask MK may be at least twice the number of the first open areas OA1 in the first mask MP1.

According to an embodiment, each of the first open area OA1 and the second open area OA2 have a size that substantially corresponds to a size of one display device. The mask MK is fixed to the mask frame MF, and then, since it includes a plurality of open areas OA1 and OA2, is used to perform a deposition process on a plurality of display devices at the same time.

According to an embodiment, the first edge portion EG1 and the second edge portion EG2 are held by clamps to fix the mask MK to the mask frame MF.

According to an embodiment, the first center portion CN1 and the second center portion CN2 are spaced apart from each other by the first welded portion WL1 and the second welded portion WL2. The first center portion CN1 and the second center portion CN2 are spaced apart from each other with the first welded portion WL1 and the second welded portion WL2 interposed therebetween. The first welded portion WL1 and the second welded portion WL2 can prevent defects, such as creases, generated in one of the first center portion CN1 and the second center portion CN2 from expanding to the other of the first center portion CN1 and the second center portion CN2. Accordingly, a defect rate of a display device can be reduced in a process of manufacturing the display device.

According to an embodiment, a mask MK includes a rectangular first mask MP1 that includes an edge portion EG1, a center portion CNM1, and a welded portion WL1, that are sequentially arranged in a lengthwise direction DR1 of the first mask. The welded portion WL1 extends from the center portion CN1, one end of the welded portion WL1 is a short side SS1 of the mask MP1, and the short side SS1 of the first mask MP1 is in contact with a short side SS2 of a rectangular second mask MP2. The rectangular first mask MP1 further includes a long side LS1 that is substantially perpendicular to the short side SS1 of the first mask MP1, and the rectangular second mask MP2 includes a long side LS2 that is substantially perpendicular to the short side SS2 of the second mask MP2. The long side LS1 of the first mask MP1 is aligned with the long side LS2 of the second mask MP2.

Figure 3:
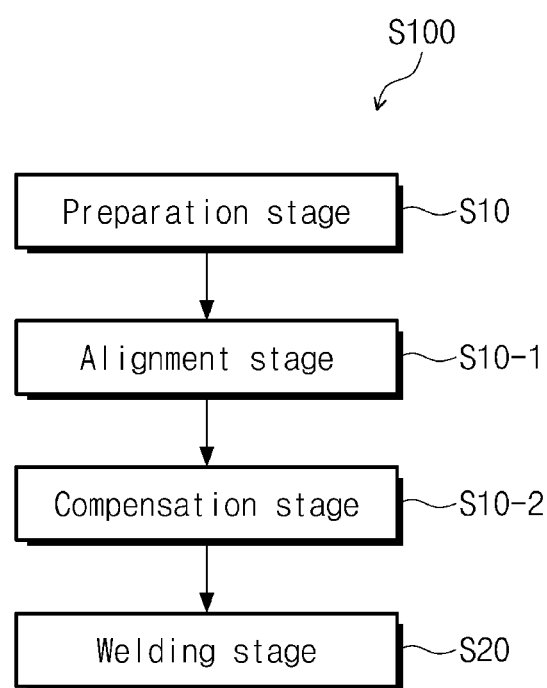
FIG. 3 is a flowchart of a method of manufacturing a mask according to an embodiment of the present disclosure.

FIG. 3 is a flowchart of a manufacturing method S100 of a mask, according to an embodiment.

The mask MK according to an embodiment can be manufactured by the mask manufacturing method S100 according to an embodiment. The mask manufacturing method S100 includes a preparation stage S10 that prepares the first mask MP1 and the second mask MP2, and a welding stage S20 that welds the first welded portion WL1 to second welded portion WL2. The mask manufacturing method S100 according to an embodiment further includes an alignment stage S10-1 and a compensation stage S10-2 between the preparation stage S10 and the welding stage S20.

According to an embodiment, the alignment stage S10-1 aligns the first mask MP1 with the second mask MP2 between the preparation stage S10 and the welding stage S20.

FIGS. 4 to 12 show masks MK in a preparation stage according to embodiments of the present disclosure.

Figure 4:
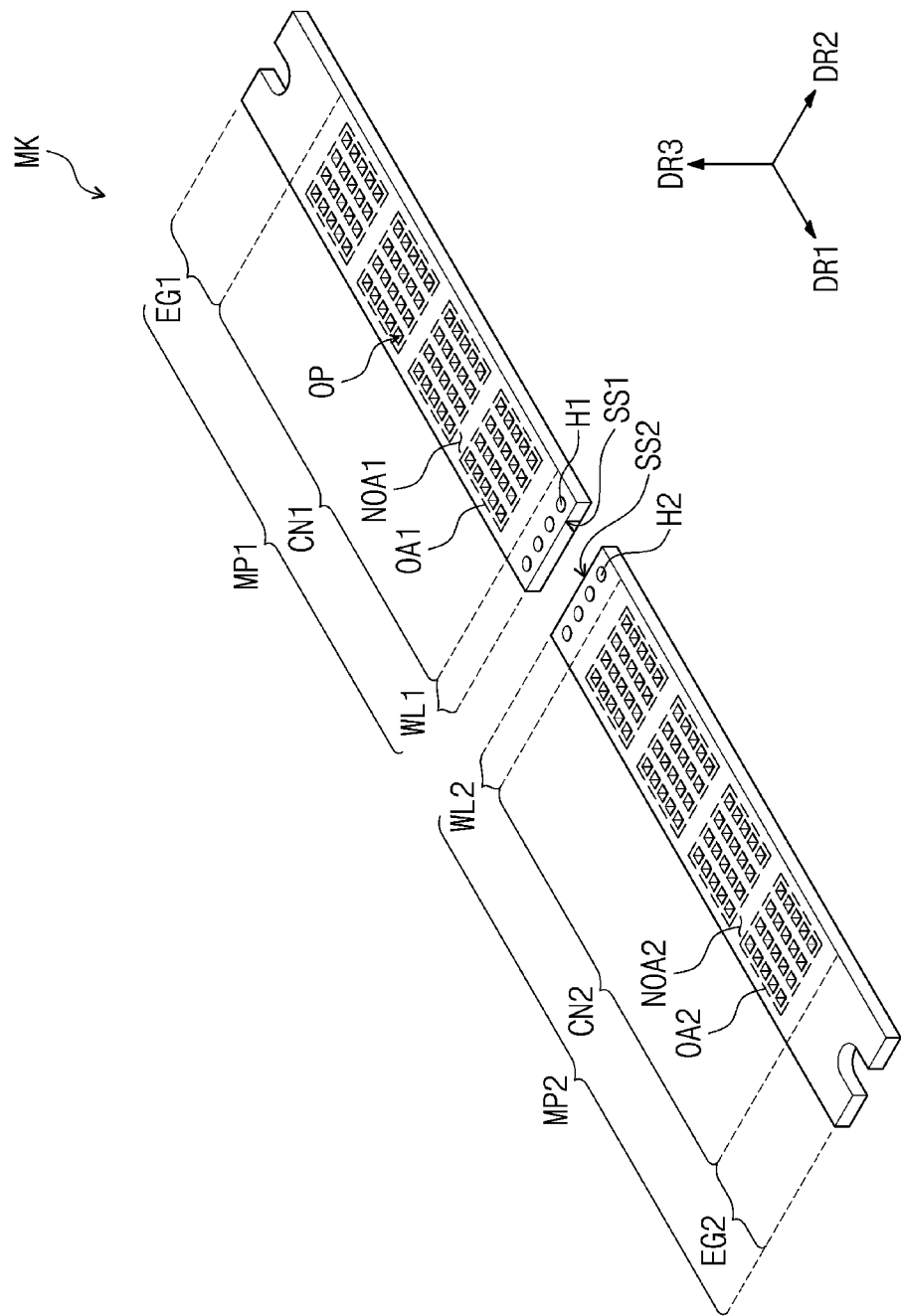
FIGS. 4 to 12 are perspective views of masks in a preparation stage according to an embodiment of the present disclosure.

Referring to FIG. 4, according to an embodiment, a first mask MP1 and a second mask MP2 are prepared in the preparation stage S10. Details of the first mask MP1 and the second mask MP2 described with reference to FIGS. 1 and 2 apply to the first mask MP1 and the second mask MP2. For example, the first mask MP1 includes a first edge portion EG1, a first center portion CN1, and a first welded portion WL1, that are sequentially arranged in the first direction DR1. The second mask MP2 includes a second welded portion WL2, a second center portion CN2, and a second edge portion EG2, that are sequentially arranged in the first direction DR1.

According to an embodiment, the first mask MP1 and the second mask MP2 are arranged such that the first welded portion WL1 and the second welded portion WL2 face each other in the preparation stage S10.

According to an embodiment, each of the first mask MP1 and the second mask MP2 is individually formed. In detail, each of the first mask MP1 and the second mask MP2 is individually formed through a photolithography process. For example, a mask sheet with a photoresist formed on upper and lower surfaces thereof is disposed on a roller. The roller rotates to move a predetermined portion of the mask sheet that needs to be exposed to an exposure module. The exposure module includes a first exposure machine and a second exposure machine spaced apart from the first exposure machine and that faces the first exposure machine. An exposure process is performed on a predetermined portion of the mask sheet disposed between the first exposure machine and the second exposure machine. Then, an open area is formed through a development process. When a plurality of exposure machines are provided, a plurality of open areas can be formed through one mask. However, there is a limit on the number of the exposure machines that can be disposed and used in the process, and accordingly, there is a limit on the number of open areas that can be formed through one mask.

Referring to FIG. 4, the first mask MP1 according to an embodiment includes a first perforated hole H1 formed in the first welded portion WL1. In detail, the first perforated hole H1 is formed adjacent to the first short side SS1 of the first welded portion WL1. The first perforated hole H1 penetrates through first welded portion WL1.

The second mask MP2 according to an embodiment includes a second perforated hole H2 formed in the second welded portion WL2. In detail, the second perforated hole H2 is formed adjacent to the second short side SS2 of the second welded portion WL2. The second perforated hole H2 penetrates through second welded portion WL2.

According to an embodiment, the first mask MP1 and the second mask MP2 are aligned with each other in the alignment stage S10-1 such that the first perforated hole H1 overlaps the second perforated hole H2. For example, the first center portion CN1 and the second center portion CN2 are arranged in the same direction, such as the first direction DR1, and the first welded portion WL1 is disposed on the second welded portion WL2. Alternatively, the first center portion CN1 and the second center portion CN2 are arranged in the same direction, such as the first direction DR1, and the second welded portion WL2 is disposed on the first welded portion WL1.

According to an embodiment, the mask MK is formed in the welding stage S20 by welding the first welded portion WL1 and the second welded portion WL2, which were aligned in the alignment stage S10-1.

However, the shapes of the first mask MP1 and the second mask MP2 are not be limited thereto. In addition, various alignment methods can be used according to the shapes of the first mask MP1 and the second mask MP2.

Figure 5:
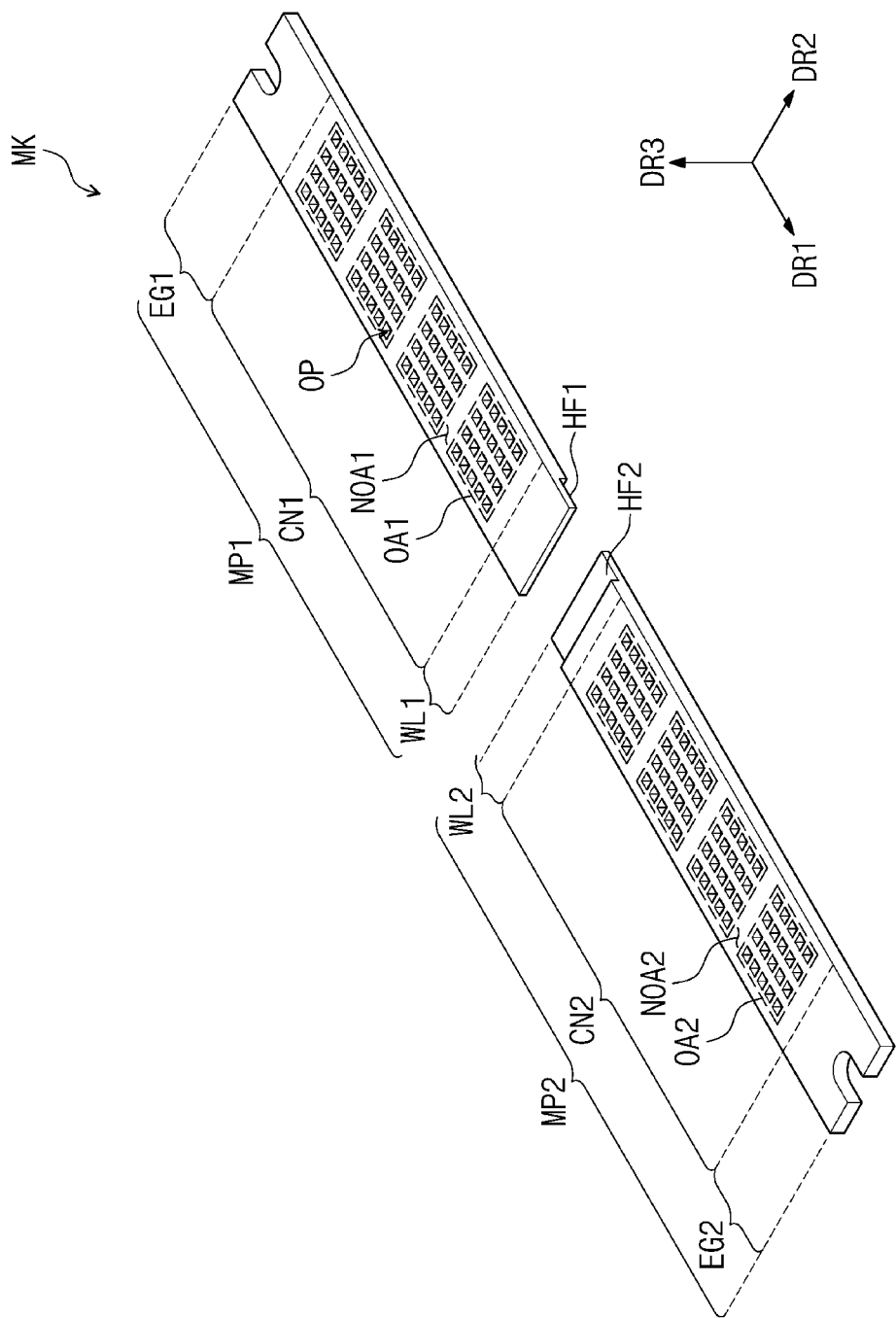

Referring to FIG. 5, according to an embodiment, each of the first mask MP1 and the second mask MP2 includes a half-etching portion. In detail, the first mask MP1 includes a first half-etching portion HF1 obtained by half-etching one end of the first welded portion WL1.

According to an embodiment, the second mask MP2 includes a second half-etching portion HF2 obtained by half-etching one end of the second welded portion WL2.

In an embodiment, the first half-etching portion HF1 is obtained by half-etching a lower portion of the first welded portion WL1. The second half-etching portion HF2 is obtained by half-etching an upper portion of the second welded portion WL2. The first and second half-etching portions HF1 and HF2 are obtained before the alignment stage S10-1. However, embodiments are not limited thereto. According to another embodiment, the first half-etching portion HF1 is obtained by half-etching an upper portion of the first welded portion WL1, and the second half-etching portion HF2 is obtained by half-etching a lower portion of the second welded portion WL2.

According to an embodiment, in the alignment stage S10-1, the first mask MP1 and the second mask MP2 are aligned with each other such that the first half-etching portion HF1 overlaps the second half-etching portion HF2. In detail, a sum of a thickness of the first half-etching portion HF1 and a thickness of the second half-etching portion HF2 aligned with the first half-etching portion HF1 is substantially equal to a thickness of the first mask MP1. For example, the thickness of the first mask MP1 is equal to or less than about 50 um, and may be equal to or less than about 40 um. The thickness of the second mask MP2 is substantially the same as the thickness of the first mask MP1. In the present disclosure, the expression "the thicknesses are substantially equal" not only means a case that the thicknesses of the components are equal to each other but also means a case that the thicknesses of the components are substantially equal to each other in consideration of fabrication errors that may generally occur in the process.

Figure 6:
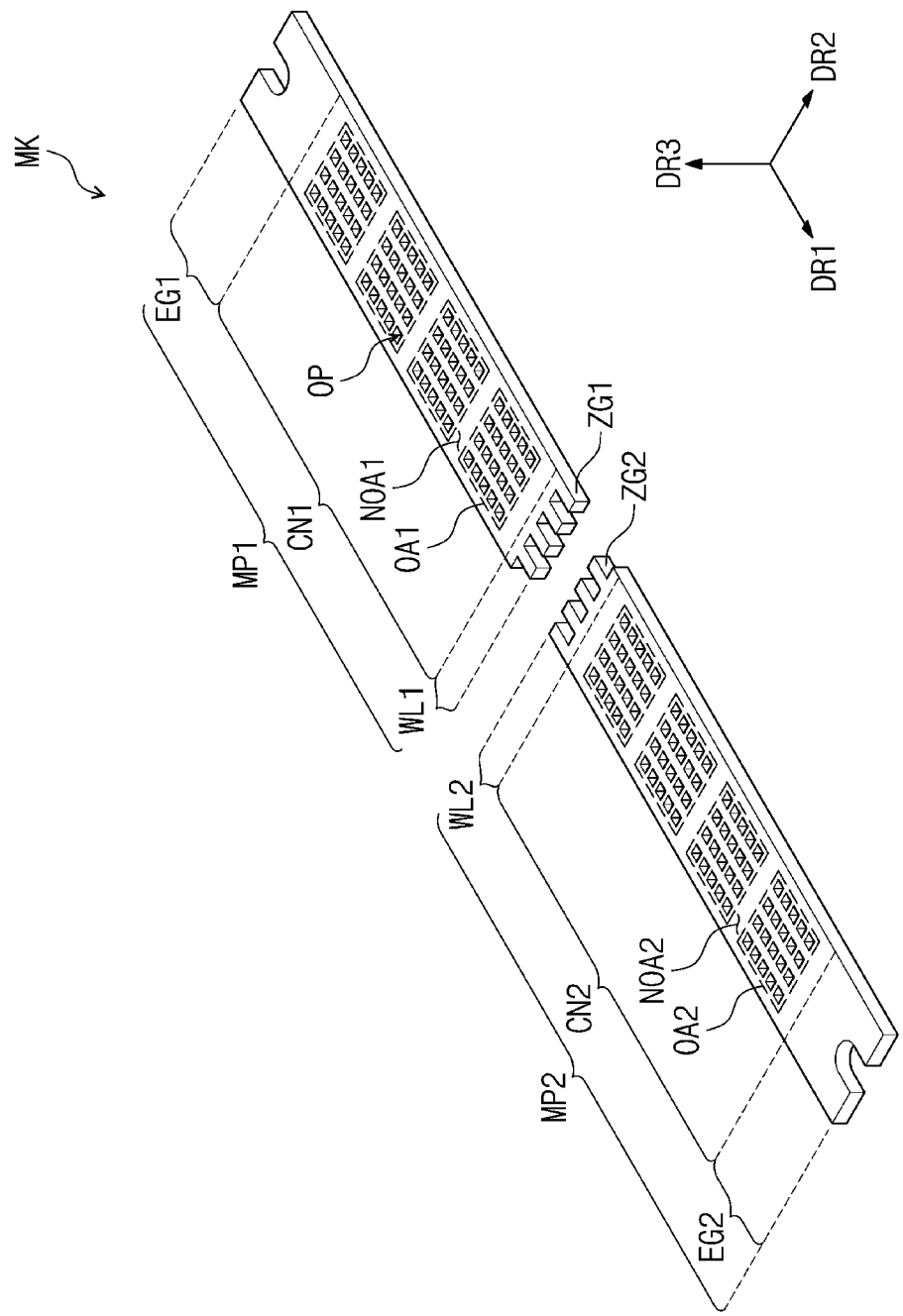

Referring to FIG. 6, one end of each of the first mask MP1 and the second mask MP2 according to an embodiment may have a oscillating shape in a plane, such as a square wave. In detail, the first mask MP1 includes a first welded portion WL1 whose one end has a first concave-convex portion ZG1 with the square wave shape.

According to an embodiment, the second mask MP2 includes a second welded portion WL2 whose one end has a second concave-convex portion ZG2 with the oscillating shape. The shape of the second concave-convex portion ZG2 complements the shape of the first concave-convex portion ZG1, such that convex portions of the first concave-convex portion ZG1 fit into concave portions of the second concave-convex portion ZG2, and vice-versa. Although FIG. 6 shows the first and second concave-convex portion ZG1, ZG2 as having a square wave shape, embodiments are not limited thereto, and the first and second concave-convex portion ZG1, ZG2 may have other shapes, such as a triangular wave shape or a sinusoidal shape.

According to an embodiment, in the alignment stage S10-1, the first mask MP1 is aligned with the second mask MP2 such that the first concave-convex portion ZG1 is engaged with the second concave-convex portion ZG2. As shown in FIG. 6, a plurality of first concave-convex portions ZG1 and second concave-convex portions ZG2 are provided. In the alignment stage S10-1, convex portions of the first concave-convex portions ZG1 are inserted into concave portions of the second concave-convex portions ZG2. Similarly, convex portions of the second concave-convex portions ZG2 are inserted into concave portions of the first concave-convex portions ZG1.

According to an embodiment, the first concave-convex portion ZG1 of the first mask MP1 and the second concave-convex portion ZG2 of the second mask MP2 are disposed on the same plane when the first mask MP1 is aligned with the second mask MP2.

Figure 7:
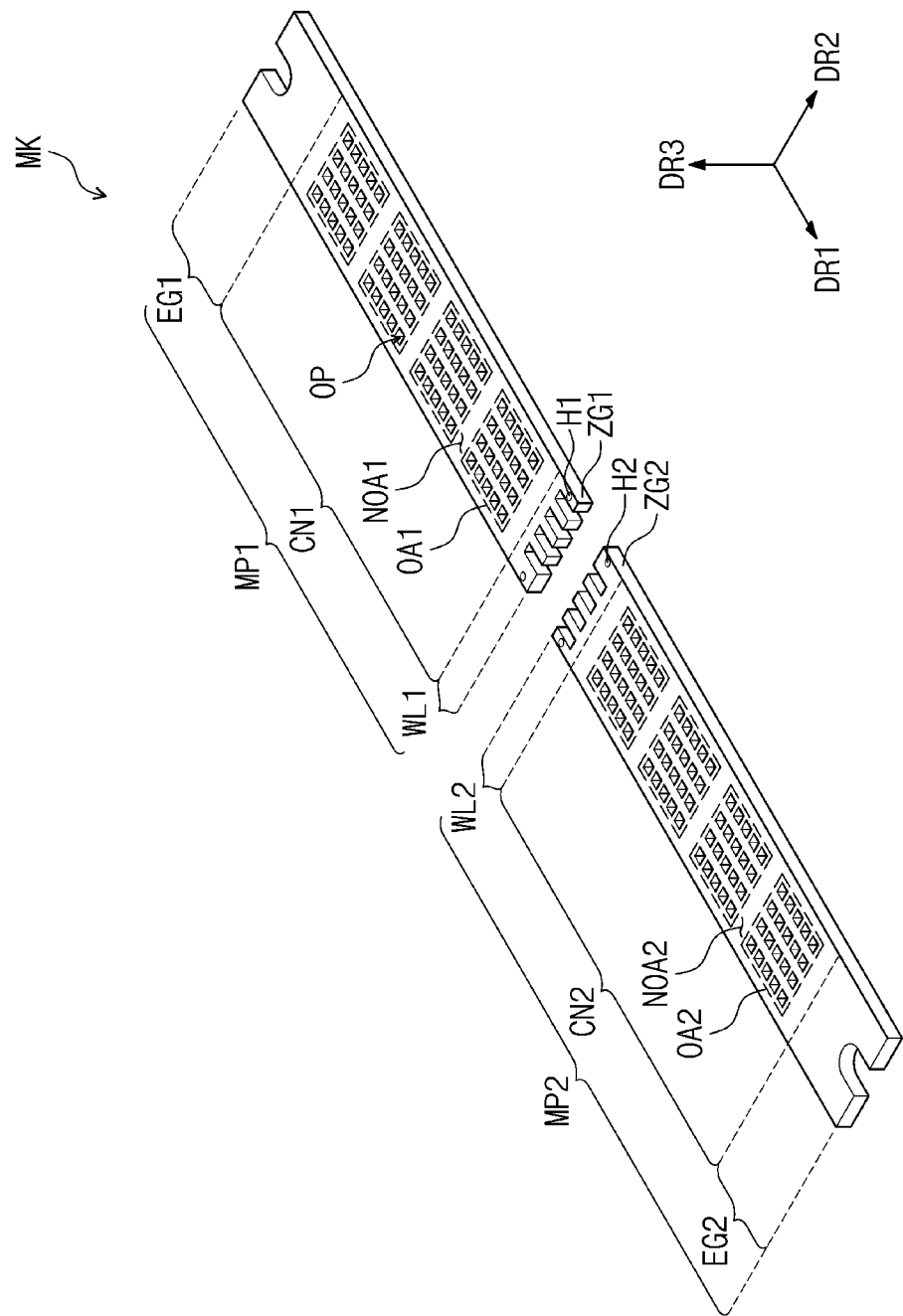

Referring to FIG. 7, according to an embodiment, the first mask MP1 includes a first perforated hole H1 formed in a first concave-convex portion ZG1. A plurality of first perforated holes H1 are provided. In detail, the first perforated holes H1 are formed in both edges of the first concave-convex portion ZG1.

According to an embodiment, the second mask MP2 includes a second perforated hole H2 formed in a second concave-convex portion ZG2. A plurality of second perforated holes H2 are provided. In detail, the second perforated holes H2 are formed in both edges of the second concave-convex portion ZG2.

According to an embodiment, in the alignment stage S10-1, the first mask MP1 is aligned with the second mask MP2 such that the first concave-convex portion ZG1 is engaged with the second concave-convex portion ZG2. The edge of the first concave-convex portion ZG1 is disposed on the edge of the second concave-convex portion ZG2 in the alignment stage S10-1. According to another embodiment, the edge of the first concave-convex portion ZG1 is disposed under the edge of the second concave-convex portion ZG2. That is, the first mask MP1 is aligned with the second mask MP2 such that the first perforated hole H1 and the second perforated hole H2 overlap each other.

In an embodiment, the first mask MP1 and the second mask MP2 include the first and second concave-convex portions ZG1 and ZG2, respectively, and the first and second perforated holes H1 and H2, respectively, and thus, alignment errors may be reduced.

Figure 8:
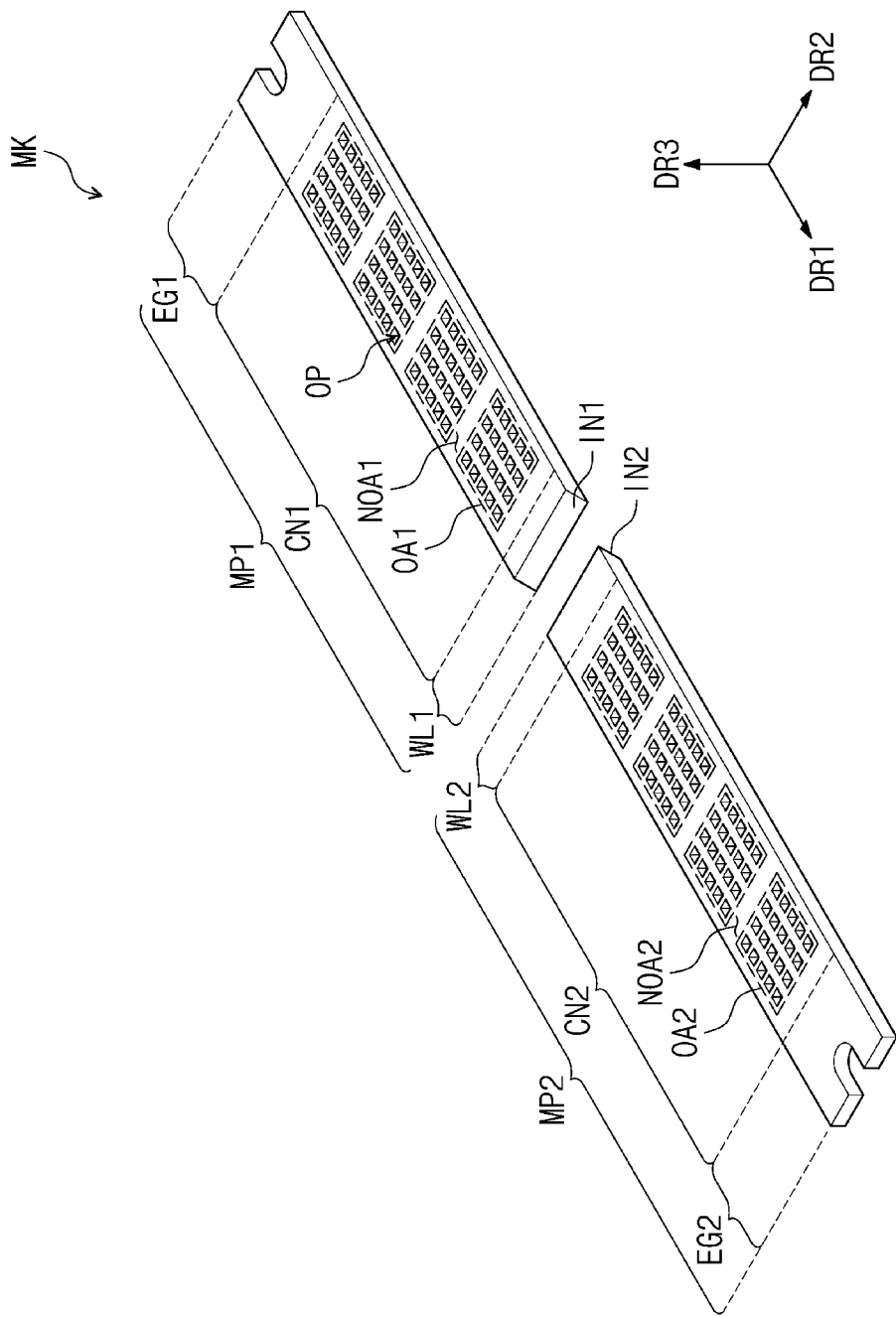

Referring to FIG. 8, according to an embodiment, one end of each of a first mask MP1 and a second mask MP2 includes an inclined surface. In detail, the first mask MP1 includes a first inclined surface IN1 in one end of the first welded portion WL1.

According to an embodiment, the second mask MP2 includes a second inclined surface IN2 in one end of the second welded portion WL2. The first inclined surface IN1 and the second inclined surface IN2 are substantially parallel to each other, so that the end of the first welded portion WL1 can overlap the end of the second welded portion WL2.

According to an embodiment, in the alignment stage S10-1, the entire surface of the first inclined surface IN1 is in contact with the entire surface of the second inclined surface IN2. The first inclined surface IN1 of the first mask MP1 overlaps the second inclined surface IN2 of the second mask MP2 when the second mask MP2 is aligned with the first mask MP1. In detail, the first inclined surface IN1 is disposed under the second inclined surface IN2 after the first mask MP1 and the second mask MP2 are aligned.

Figure 9:
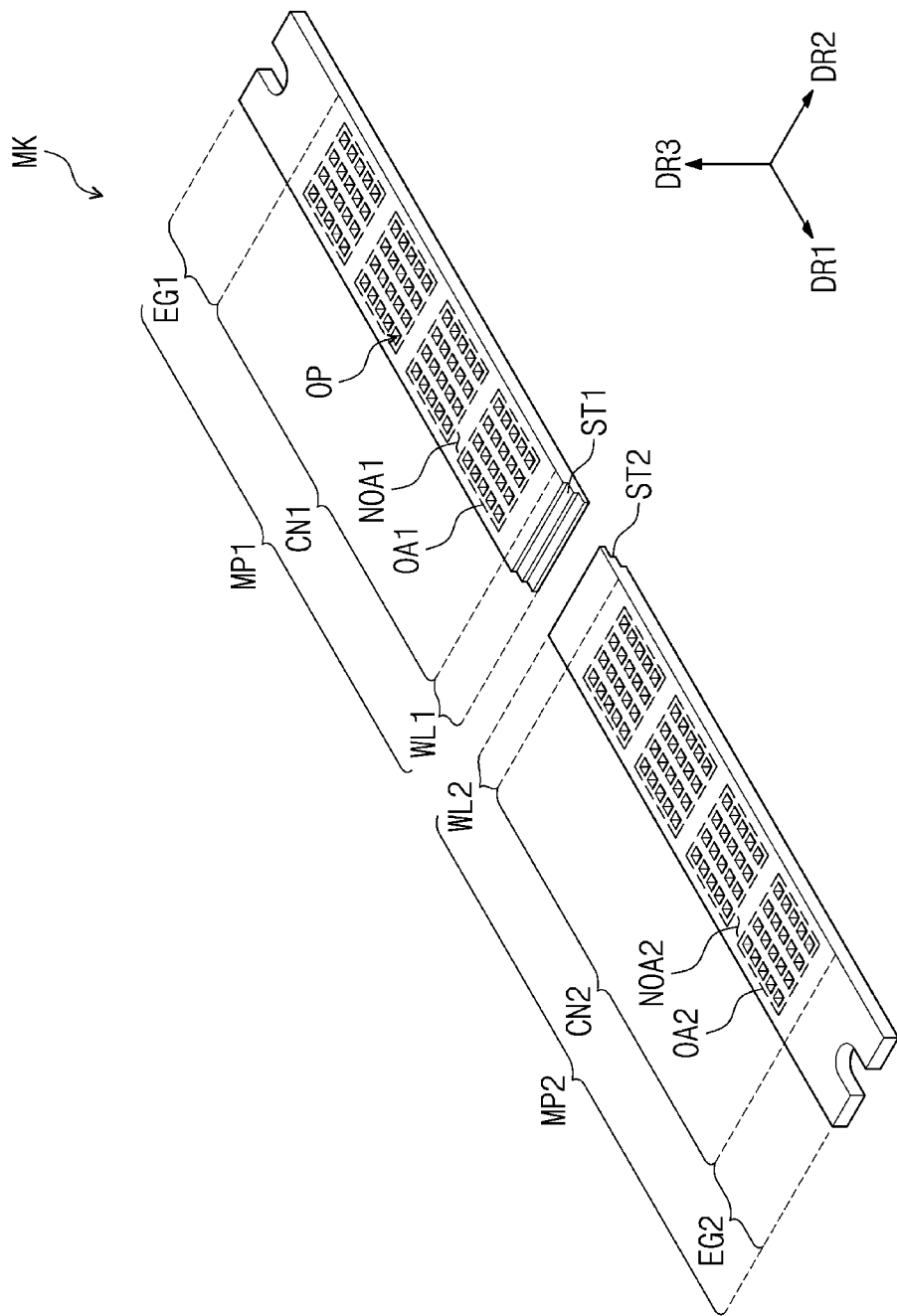

Referring to FIG. 9, according to an embodiment, one end of each of the first mask MP1 and the second mask MP2 has a stepped shape. In detail, the first mask MP1 includes a first stepped portion ST1 in which one end of the first welded portion WL1 has steps. The steps in the first step portion ST1 are formed on an upper surface of the first mask MP1. The second mask MP2 includes a second stepped portion ST2 in which one end of the second welded portion WL2 has steps. The steps in the second step portion ST2 are formed on a lower surface of the second mask MP2. The steps in the second step portion ST2 of the second mask MP2 fit above the steps of the first step portion ST1 of the first mask MP1.

The first and second stepped portions ST1 and ST2 are modified embodiments of the first and second half-etching portions HF1 and HF2 described with reference to FIG. 5. As shown in FIG. 9, the half-etching process may be applied in various ways, and thus, a plurality of steps can be formed in the first and second welded portions WL1 and WL2.

According to an embodiment, in the alignment stage S10-1, the first stepped portion ST1 is engaged with the second stepped portion ST2. In detail, the first stepped portion ST1 is disposed under the second stepped portion ST2.

Figure 10:
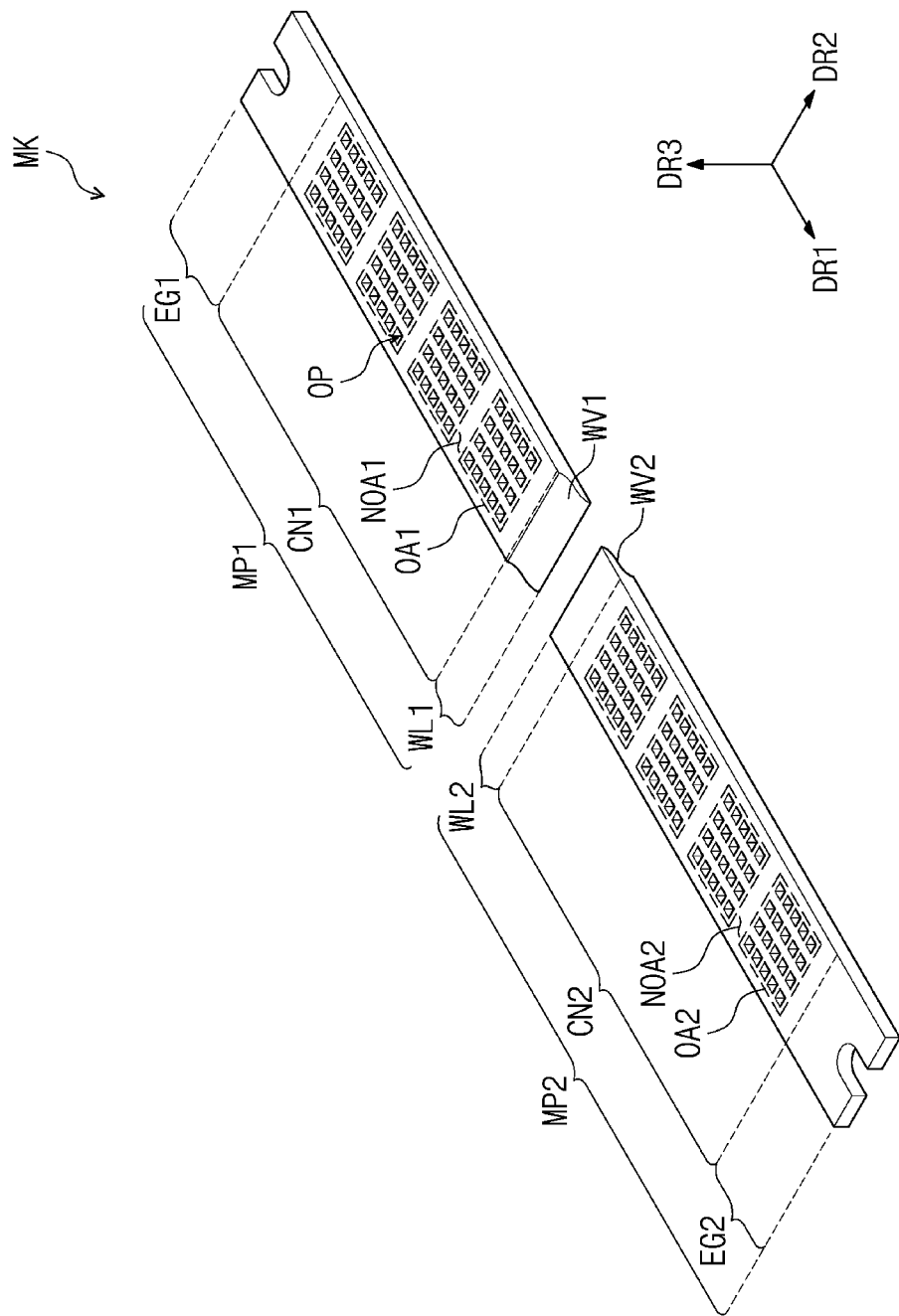

Referring to FIG. 10, according to an embodiment, one end of each of the first mask MP1 and the second mask MP2 includes a curved surface. In detail, the first mask MP1 includes a first welded portion WL1 whose one end has a first wave portion WV1 with a wave shape. The wave shape in the first wave portion WV1 is formed on an upper surface of the first mask MP1. The second mask MP2 includes a second welded portion WL2 whose one end has a second wave portion WV2 with a wave shape. The wave shape in the second wave portion WV2 is formed on a lower surface of the second mask MP2. The wave shape in the second wave portion WV2 of the second mask MP2 fits above the wave shape of the first wave portion WV1 of the first mask MP1.

According to an embodiment, in the alignment stage S10-1, the first wave portion WV1 is engaged with the second wave portion WV2. In detail, the first wave portion WV1 is disposed under the second wave portion WV2.

Figure 11:
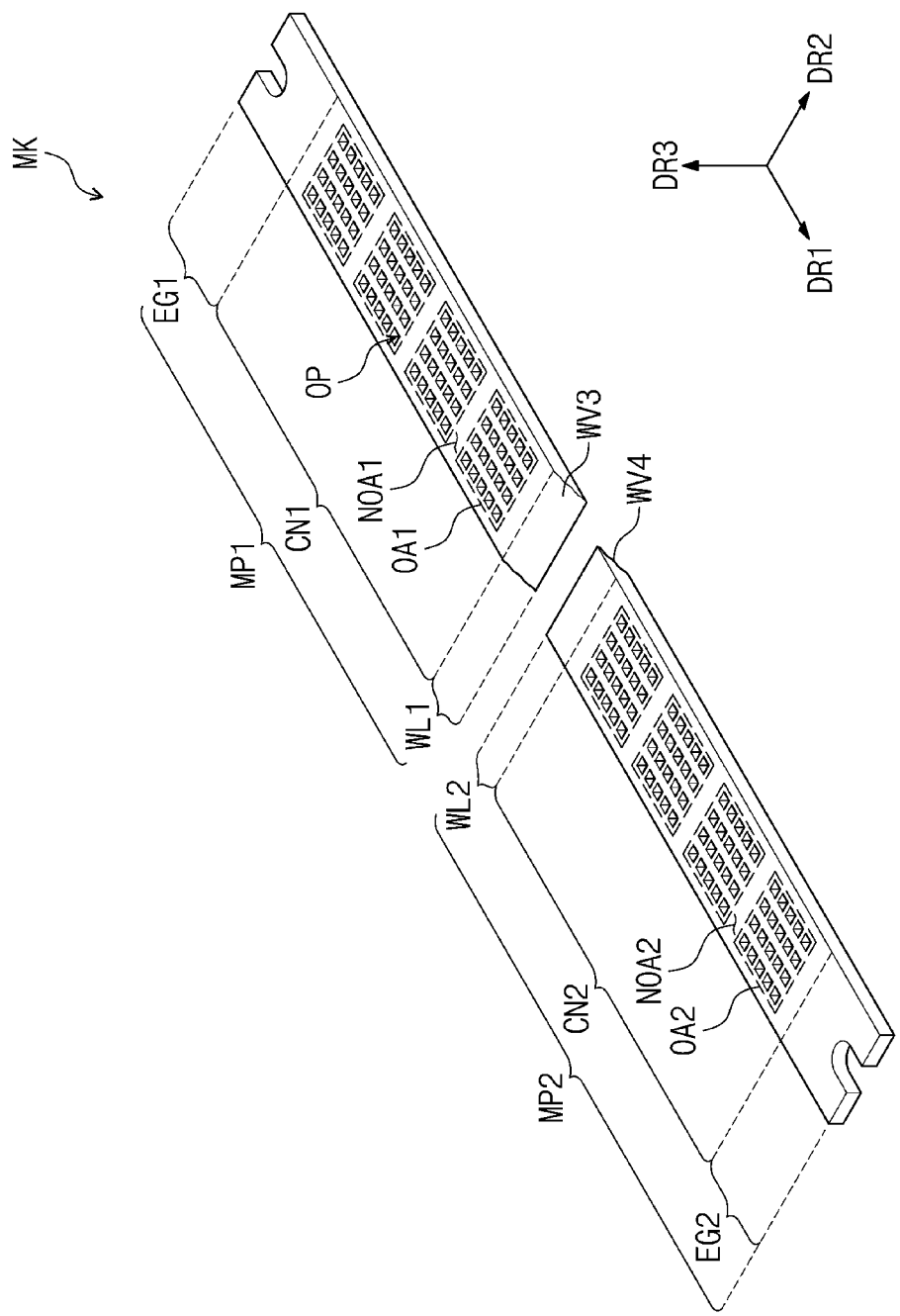

Referring to FIG. 11, according to an embodiment, one end of each of the first mask MP1 and the second mask MP2 includes a curved surface. In detail, the first mask MP1 includes a first welded portion WL1 whose one end has a third wave portion WV3 with a wave shape. The wave shape in the third wave portion WV3 is formed on an upper surface of the first mask MP1. The second mask MP2 includes a second welded portion WL2 whose one end has a fourth wave portion WV4 with a wave shape. The wave shape in the fourth wave portion WV4 is formed on a lower surface of the second mask MP2. The wave shape in the fourth wave portion WV4 of the second mask MP2 fits above the wave shape of the third wave portion WV3 of the first mask MP1.

The third and fourth wave portions WV3 and WV4 are modified embodiments of the first and second wave portions WV1 and WV2 described with reference to FIG. 10. As shown in FIG. 11, the curved surface of the one end of the first and second welded portions WL1 and WL2 may have a variety of shapes.

According to an embodiment, in the alignment stage S10-1, the third wave portion WV3 is engaged with the fourth wave portion WV4. In detail, the third wave portion WV3 is disposed under the fourth wave portion WV4.

Figure 12:
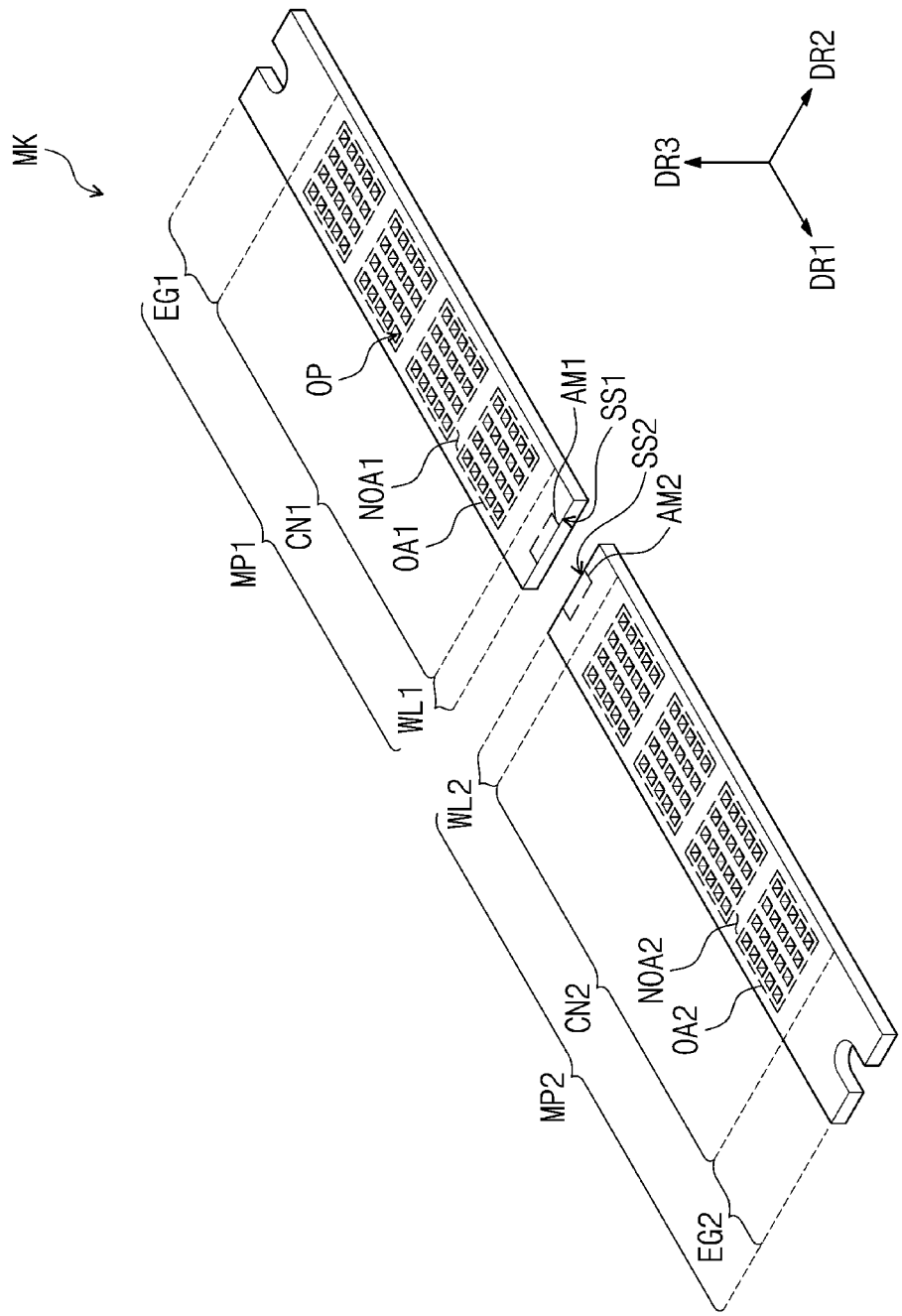

Referring to FIG. 12, according to an embodiment, each of the first mask MP1 and the second mask MP2 includes an alignment mark. In detail, the first mask MP1 includes a first alignment mark AM1 disposed on an upper surface of a first welded portion WL1. The first alignment mark AM1 is in contact with a first short side SS1.

According to an embodiment, the second mask MP2 includes a second alignment mark AM2 disposed on an upper surface of a second welded portion WL2. The second alignment mark AM2 is in contact with a second short side SS2.

According to an embodiment, each of the first alignment mark AM1 and the second alignment mark AM2 is respectively disposed on the upper surfaces of the first and second welded portions WL1 and WL2. The upper surfaces of the first and second welded portions WL1 and WL2 face the third direction DR3. Rear surfaces of the first and second welded portions WL1 and WL2 may face a direction opposite to the third direction DR3.

The first and second alignment marks AM1 and AM2 may be components added to the upper surfaces of the first and second welded portions WL1 and WL2, or recesses formed in the upper surfaces that recessed in the direction opposite to the third direction DR3.

According to an embodiment, in the alignment stage S10-1, the first short side SS1 is aligned with the second short side SS2 such that the first alignment mark AM1 is in contact with the second alignment mark AM2.

The first perforated hole H1, the first half-etching portion HF1, the first concave-convex portion ZG1, the first inclined surface IN1, the first stepped portion ST1, the first wave portion WV1, the third wave portion WV3, and the first alignment mark AM1, which are formed at one end of the first welded portion WL1 and described with reference to FIGS. 4 to 12, may be referred to as a first pattern. The second perforated hole H2, the second half-etching portion HF2, the second concave-convex portion ZG2, the second inclined surface IN2, the second stepped portion ST2, the second wave portion WV2, the fourth wave portion WV4, and the second alignment mark AM2, which are formed at the one end of the second welded portion WL2 and described with reference to FIGS. 4 to 12, may be referred to as a second pattern. However, the first pattern and the second pattern may have a variety of other shapes without being limited to those shown in FIGS. 4 to 12.

Figure 13:
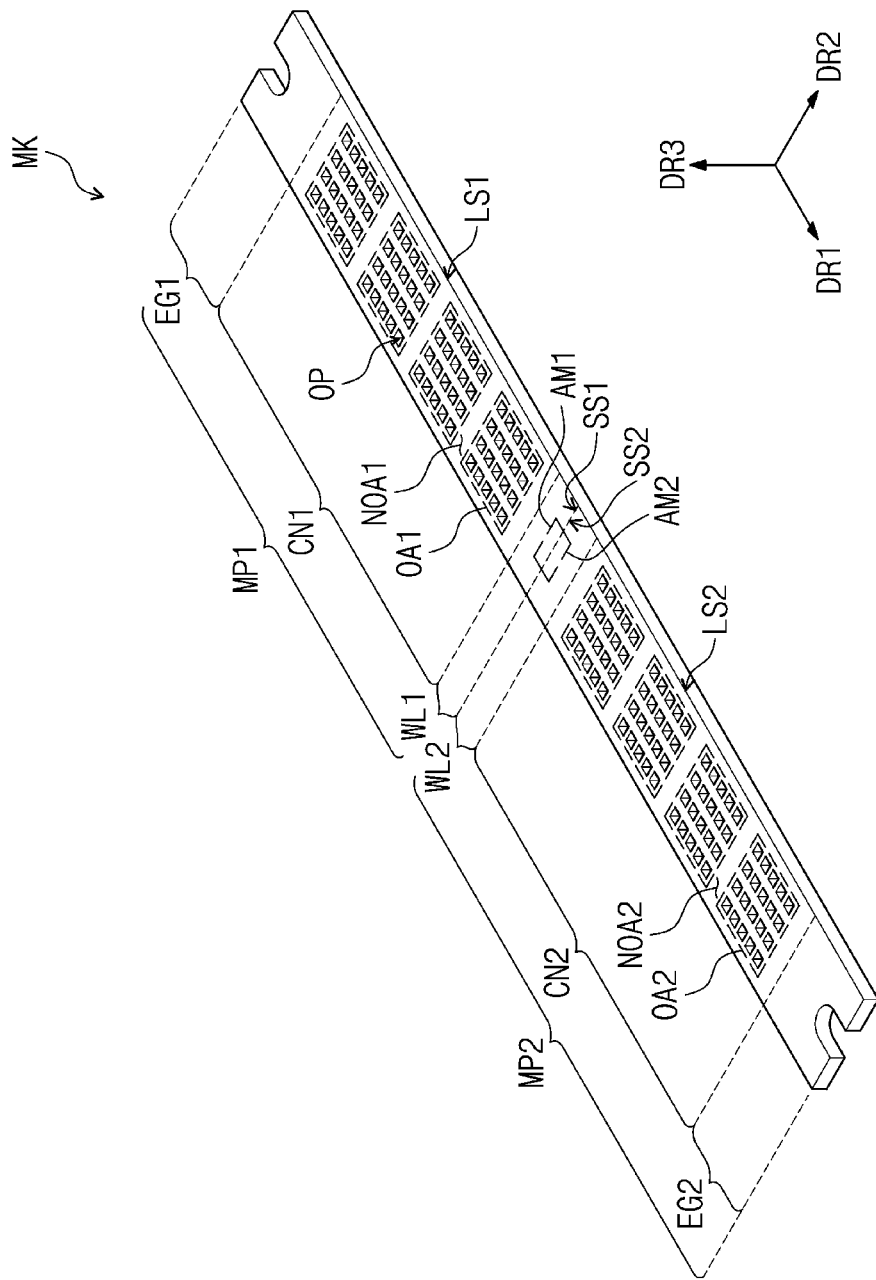
FIG. 13 is a perspective view of a process of a method of manufacturing a mask according to an embodiment of the present disclosure.

FIG. 13 is a perspective view of a process of the mask manufacturing method S100 according to an embodiment of the present disclosure. FIG. 13 shows an example of the alignment stage S10-1, and in detail, shows the alignment of the first mask MP1 with the second mask MP2 shown in FIG. 12.

According to an embodiment, when the first mask MP1 and the second mask MP2 are aligned with each other, the first short side SS1 is in contact with the second short side SS2, and the first alignment mark AM1 is in contact with the second alignment mark AM2. In addition, the first long side LS1 is aligned with the second long side LS2 in the first direction DR1.

According to an embodiment, the first welded portion WL1 and the second welded portion WL2 of the first mask MP1 and the second mask MP2, respectively, which are aligned with each other, can be welded to form the mask MK.

Figure 14:
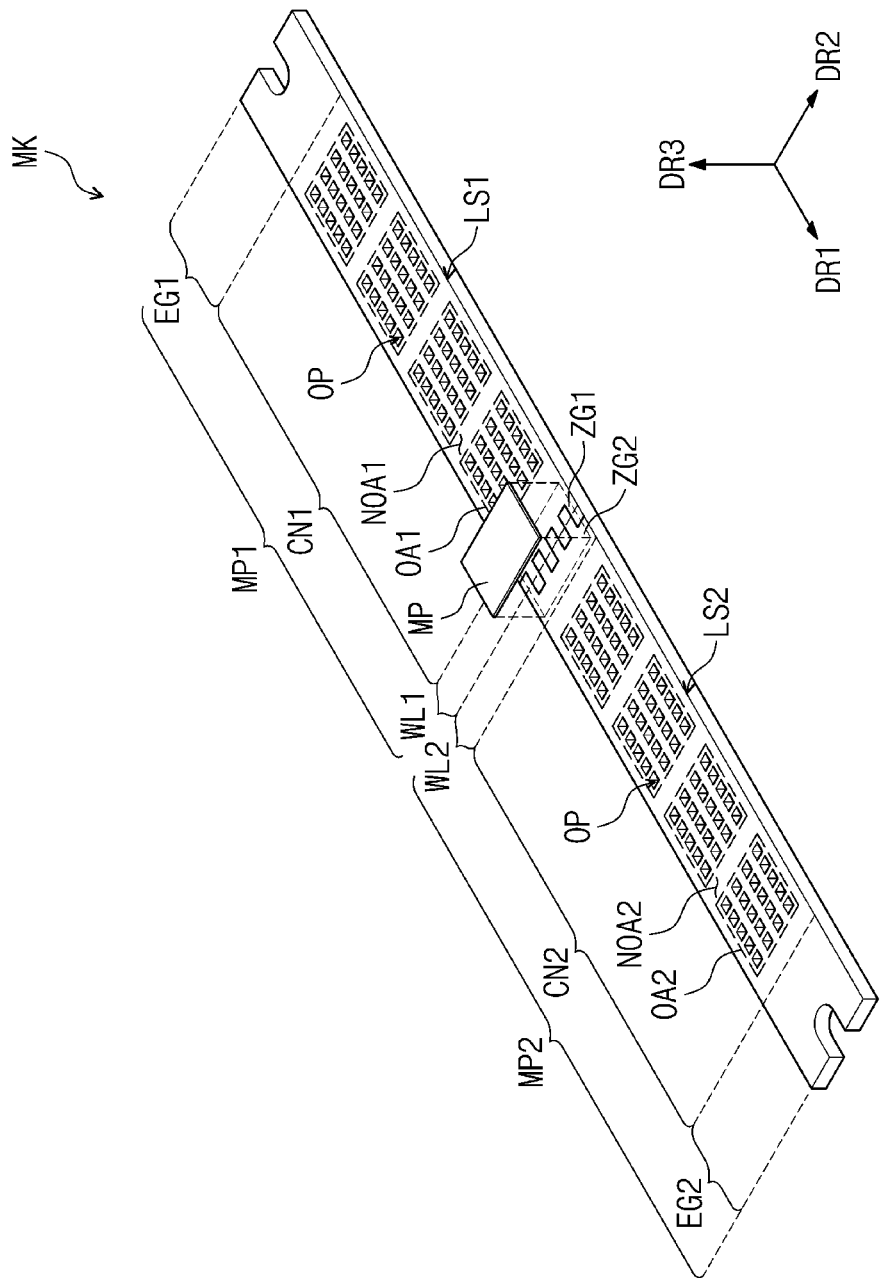
FIG. 14 is a perspective view of a process of a method of manufacturing a mask according to an embodiment of the present disclosure.

FIG. 14 shows a process of the mask manufacturing method S100 according to an embodiment of the present disclosure. FIG. 14 shows an example of the alignment stage S10-1, and in detail, shows the first mask MP1 and the second mask MP2 of FIG. 6 being aligned with each other.

According to an embodiment, the first concave-convex portion ZG1 of the first mask MP1 is engaged with the second concave-convex portion ZG2 of the second mask MP2.

According to an embodiment, the first concave-convex portion ZG1 and the second concave-convex portion ZG2, when aligned with each other, are disposed on the same plane. The first mask MP1 and the second mask MP2 are disposed on the same plane.

The mask manufacturing method S100 according to an embodiment further includes the compensation stage S10-2 after the alignment stage S10-1 in which a metallic thin film MP is disposed on the first mask MP1 and the second mask MP2. In detail, the mask manufacturing method S100 according to an embodiment includes the preparation stage S10, the alignment stage S10-1, the compensation stage S10-2, and the welding stage S20.

According to an embodiment, in the compensation stage S10-2, the metallic thin film MP is disposed on the first welded portion WL1 and the second welded portion WL2. For example, the metallic thin film MP may include Invar.

In the welding stage S20, according to an embodiment, the first welded portion WL1 of the first mask MP1 and the second welded portion WL2 of the second mask MP2 are welded to each other.

When the mask manufacturing method S100 according to an embodiment includes the compensation stage S10-2, the first welded portion WL1, the second welded portion WL2, and the metallic thin film MP are welded in the welding stage S20.

As the mask manufacturing method S100 according to an embodiment includes the compensation stage S10-2, although a gap may be generated between the first concave-convex portion ZG1 and the second concave-convex portion ZG2 in the alignment stage S10-1, the gap is closed in the welding stage S20 when the first welded portion WL1, the second welded portion WL2, and the metallic thin film MP are welded to each other.

Even though the first concave-convex portion ZG1 and the second concave-convex portion ZG2 might not be completely engaged with each other due to process errors in the alignment stage S10-1, errors in the engagement between first concave-convex portion ZG1 and the second concave-convex portion ZG2 are compensated in the compensation stage S10-2. The mask manufacturing method S100 according to an embodiment includes the compensation stage S10-2, and thus, defects of the mask MK that are caused by welding can be reduced.

FIG. 14 shows an embodiment in which the compensation stage S10-2 is performed on the first mask MP1 and the second mask MP2 shown in FIG. 6, however, embodiments are not limited thereto. The compensation stage S10-2 can be additionally performed on the first mask MP1 and the second mask MP2 shown in FIGS. 4, 5, and 7 to 11 as needed after the alignment stage S10-1.

Figure 15:
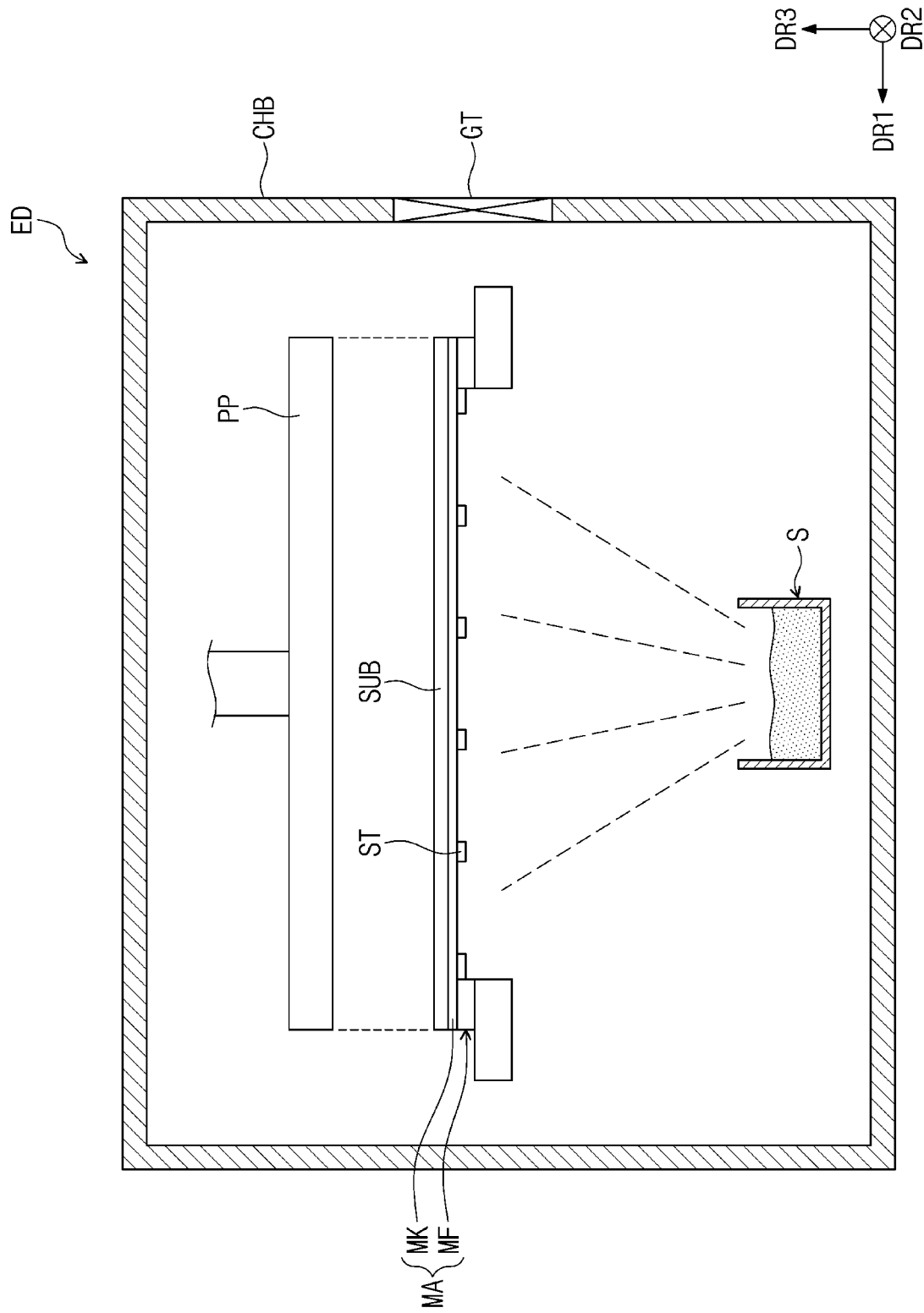
FIG. 15 shows a process of manufacturing a display device using a mask according to an embodiment of the present disclosure.

FIG. 15 shows a manufacturing process of a display device using the mask MK according to an embodiment of the present disclosure. Hereinafter, a process of depositing an organic light emitting element on a substrate SUB of a display device using the above-mentioned mask MK will be described.

Referring to FIG. 15, according to an embodiment, a deposition apparatus ED includes a chamber CHB, a deposition source S, a stage ST, a driving plate PP, and a mask assembly MA.

According to an embodiment, the deposition source S, the stage ST, the driving plate PP, and the mask assembly MA are disposed in the chamber CHB. The chamber CHB provides a confined space. The chamber CHB includes at least one gate GT. The chamber CHB can be opened and closed by the gate GT. The mask assembly MA and the substrate SUB can be loaded into or unloaded from the chamber CHB through the gate GT in the chamber CHB. The substrate SUB is a base substrate on which a deposition material is deposited in the display device.

According to an embodiment, the deposition source S is disposed at a lower side of the chamber CHB. The deposition source S includes the deposition material. The deposition material can be sublimated or vaporized and includes at least one of an inorganic material, a metal material, and an organic material. The deposition source S according to a present embodiment will be described with reference to an organic material used to manufacture an organic light emitting device.

According to an embodiment, the stage ST is disposed above the deposition source S. The mask assembly MA is disposed on the stage ST. The mask assembly MA faces the deposition source S. The stage ST overlaps the mask frame MF in a plane and supports the mask assembly MA. The stage ST is located outside a path through which the deposition material is deposited onto the substrate SUB from the deposition source S.

According to an embodiment, the substrate SUB is disposed on the mask assembly MA. The driving plate PP is disposed on the substrate SUB. The driving plate PP aligns the substrate SUB with the mask assembly MA.

According to an embodiment, the deposition material is deposited onto the substrate SUB through the openings OP (refer to FIG. 2) of the mask MK. Consequently, an organic light emitting element can be deposited onto the substrate SUB using the mask assembly MA.

According to a mask manufacturing method of an embodiment, the mask MK through which the plurality of open areas comprising the first and second open areas OA1 and OA2 (refer to FIG. 2) are formed is obtained by welding the first mask MP1 and the second mask MP2. The plurality of organic light emitting elements are deposited on the substrate SUB using the mask MK according to an embodiment, and an efficiency of the manufacturing process of the display device can be improved.

Although embodiments of the present disclosure have been described, it is understood that embodiments of the present disclosure should not be limited to these embodiments but various changes and modifications can be made by one ordinary skilled in the art within the spirit and scope of embodiments of the present disclosure as claimed in the attached claims.

Therefore, the disclosed subject matter should not be limited to any single embodiment described herein, and the scope of embodiments of the present inventive concept shall be determined according to the attached claims.

What is claimed is:

1. A method of manufacturing a mask, comprising:
preparing a first mask that includes a first long side that extends in a first direction and a first short side that extends in a second direction that crosses the first direction, wherein the first long side is longer than the first short side, wherein the first mask includes a first edge portion, a first center portion, and a first welded portion, that are sequentially arranged in the first direction,
preparing a second mask that includes a second long side that extends in the first direction and a second short side that extends in the second direction, wherein the second long side is longer than the second short side, wherein the second mask includes a second welded portion, a second center portion, and a second edge portion, that are sequentially arranged in the first direction; and
welding the first welded portion of the first mask to the second welded portion of the second mask, wherein
the first welded portion of the first mask includes a first pattern formed at one end,
the second welded portion of the second mask includes a second pattern formed at one end, and
wherein the first pattern and the second pattern are formed by a half-etching process.

2. The method of claim 1, further comprising
aligning the first and second masks with each other, wherein
the first pattern includes a first perforated hole formed through the first welded portion,
the second pattern includes a second perforated hole formed through the second welded portion,
wherein aligning the first and second masks allows the first perforated hole to overlap the second perforated hole after preparing the first and second masks.

3. The method of claim 1, further comprising
aligning the first and second masks with each other, wherein
the first pattern includes a first alignment mark disposed on an upper surface of the first welded portion,
the second pattern includes a second alignment mark disposed on an upper surface of the second welded portion,
wherein aligning the first and second masks allows the first alignment mark to overlap the second alignment mark after preparing the first and second masks.

4. The method of claim 1,
wherein the method further includes aligning the first pattern with the second pattern after preparing the first and second masks.

5. The method of claim 4, wherein each of the first pattern and the second pattern includes an inclined surface or steps.

6. The method of claim 4, wherein each of the first pattern and the second pattern has an oscillating shape.

7. The method of claim 4, wherein
the first welded portion further includes a first perforated hole formed adjacent to the first pattern,
the second welded portion further includes a second perforated hole formed adjacent to the second pattern,
wherein aligning the first and second masks further includes aligning the first mask with the second mask wherein the first perforated hole overlaps the second perforated hole.

8. The method of claim 4, further comprising
disposing a metallic film on the first welded portion and the second welded portion after aligning the first and second masks with each other,
wherein welding the first and second welded portions includes welding the first welded portion, the second welded portion, and the metallic film to each other.

* * * * *